(12) United States Patent
Cox et al.

(10) Patent No.: US 10,394,140 B2
(45) Date of Patent: Aug. 27, 2019

(54) LITHOGRAPHIC APPARATUS

(71) Applicant: ASML Netherlands B.V., Veldhoven (NL)

(72) Inventors: Hendrikus Herman Marie Cox, Eindhoven (NL); Paul Corné Henri De Wit, Eindhoven (NL); Arie Jeffrey Den Boef, Waalre (NL); Adrianus Hendrik Koevoets, Mierlo (NL); Jim Vincent Overkamp, Eindhoven (NL); Frits Van Der Meulen, Eindhoven (NL); Jacobus Cornelis Gerardus Van Der Sanden, Geldrop (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/326,410

(22) PCT Filed: Jul. 28, 2017

(86) PCT No.: PCT/EP2017/069104
§ 371 (c)(1),
(2) Date: Feb. 19, 2019

(87) PCT Pub. No.: WO2018/041491
PCT Pub. Date: Mar. 8, 2018

(65) Prior Publication Data
US 2019/0187573 A1    Jun. 20, 2019

(30) Foreign Application Priority Data
Sep. 2, 2016  (EP) ..................................... 16186948

(51) Int. Cl.
*G03F 7/20*    (2006.01)

(52) U.S. Cl.
CPC ...... *G03F 7/70875* (2013.01); *G03F 7/70625* (2013.01)

(58) Field of Classification Search
CPC .................................................. G03F 7/70875
See application file for complete search history.

(56) References Cited

U.S. PATENT DOCUMENTS 5,581,324 A * 12/1996 Miyai ................. G03F 7/70258
355/53
6,228,544 B1 * 5/2001 Ota ......................... G03F 7/707
430/30

(Continued)

FOREIGN PATENT DOCUMENTS

WO     WO 2016/169758 A1    10/2016

OTHER PUBLICATIONS

International Search Report and Written Opinion of the International Searching Authority directed to related International Patent Application No. PCT/EP2017/069104, dated Oct. 20, 2017; 9 pages.

*Primary Examiner* — Michelle M Iacoletti
(74) *Attorney, Agent, or Firm* — Sterne, Kessler, Goldstein & Fox P.L.L.C.

(57) ABSTRACT

A lithographic apparatus comprises a projection system which is configured to project a patterned radiation beam to form an exposure area on a substrate held on a substrate table. The lithographic apparatus further comprises a heating apparatus comprises one or more radiation sources configured to provide additional radiation beams which illuminate and heat part of the substrate during the exposure.

16 Claims, 3 Drawing Sheets

(56) References Cited

U.S. PATENT DOCUMENTS

| | | |
|---|---|---|
| 6,440,619 B1 | 8/2002 | Feldman |
| 6,445,439 B1 | 9/2002 | McCullough |
| 2003/0235682 A1 | 12/2003 | Sogard |
| 2004/0053169 A1 | 3/2004 | Kindt |
| 2004/0256574 A1 | 12/2004 | Namba |
| 2007/0273851 A1 | 11/2007 | Finders et al. |
| 2008/0212053 A1 | 9/2008 | Ottens et al. |
| 2011/0310366 A1 | 12/2011 | Maehara et al. |
| 2015/0192856 A1 | 7/2015 | Onvlee et al. |
| 2015/0331338 A1 | 11/2015 | Arlemark et al. |
| 2016/0048085 A1 | 2/2016 | Cadee et al. |

\* cited by examiner

LITHOGRAPHIC APPARATUS

CROSS-REFERENCE TO RELATED APPLICATIONS

This application claims priority of EP application 16186948.2 which was filed on Sep. 2, 2016 and which is incorporated herein in its entirety by reference

FIELD

The present invention relates to a lithographic apparatus and to a lithographic method.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A radiation beam used to project a pattern onto a substrate will deliver a substantial amount of heat to that substrate, and will cause localised heating of the substrate. Localised expansion of the substrate caused by the heating will reduce the accuracy with which a projected pattern overlies patterns already present on the substrate.

SUMMARY

It may be desirable to provide a lithographic apparatus which addresses the problem identified above or some other problem associated with the prior art.

According to a first aspect of the invention <to be added>

BRIEF DESCRIPTION OF THE DRAWINGS

Embodiments of the invention will now be described, by way of example only, with reference to the accompanying schematic drawings, in which.

DETAILED DESCRIPTION

Figure 1:
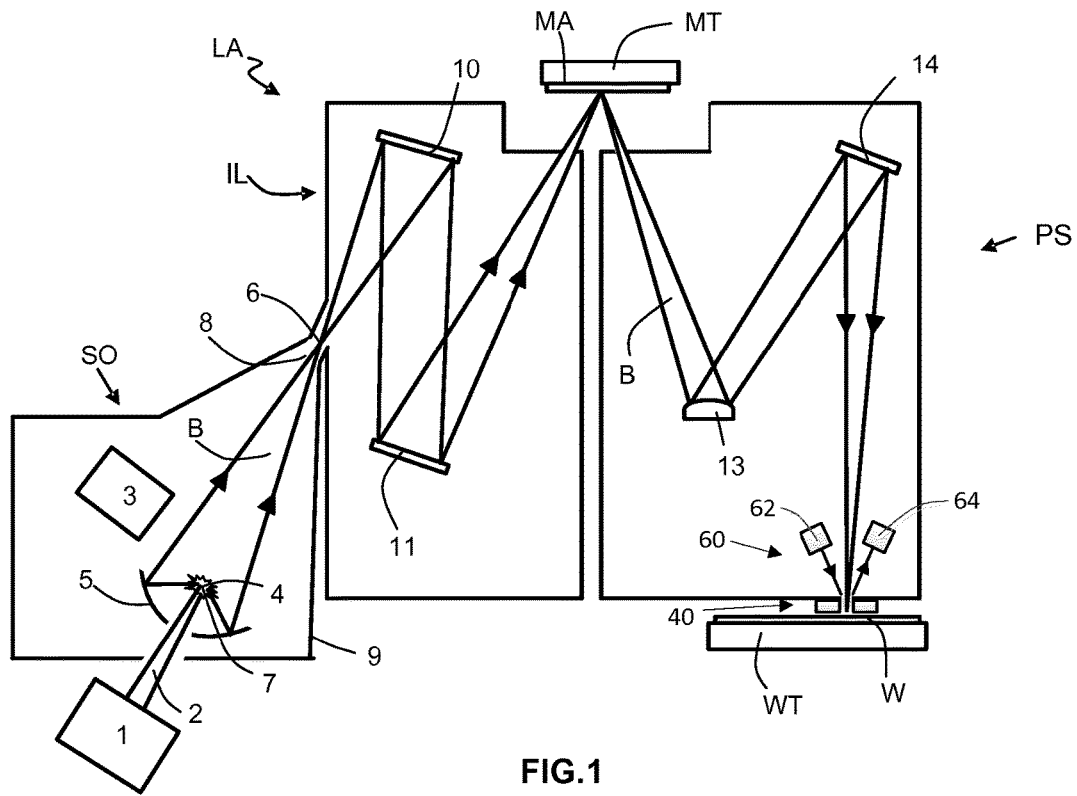
FIG. 1 schematically depicts a lithographic system comprising a lithographic apparatus according to an embodiment of the invention.

FIG. 1 shows a lithographic system including a cooling apparatus according to an embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the patterned radiation beam B onto a substrate W held by the substrate table WT. The projection system PS may apply a reduction factor to the patterned radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

A cooling apparatus 40 is located above the substrate W. The cooling apparatus 40 provides localised cooling of the substrate in the vicinity of the patterned radiation beam B. The cooling apparatus 40 is described in detail further below.

The lithographic apparatus LA is provided with a heating apparatus 60. The heating apparatus comprises one or more radiation sources 62 configured to provide one or more additional radiation beams which illuminate and heat part of the substrate W. The one or more additional radiation beams may illuminate and heat at least part of an exposure area (i.e. an area which receives the patterned radiation beam B during operation of the lithographic apparatus). The heating apparatus further comprises one or more sensors 64 configured to detect infra-red radiation from the substrate W. The heating apparatus 60 is described in detail further below.

Figure 2:
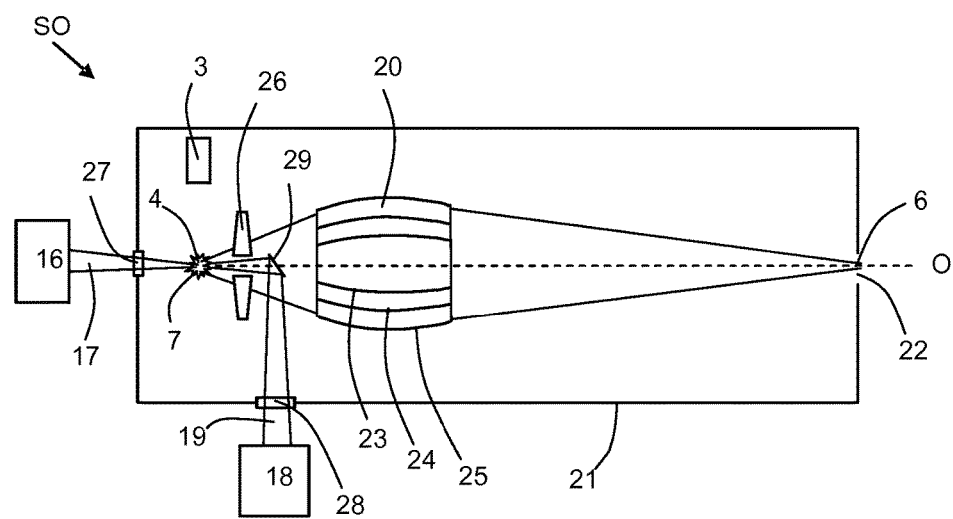
FIG. 2 schematically depicts a radiation source of the lithographic apparatus.

FIG. 2 shows a laser produced plasma (LPP) radiation source SO which has an alternative configuration to the radiation source shown in FIG. 1. The radiation source SO includes a fuel emitter 3 which is configured to deliver fuel to a plasma formation region 4. The fuel may for example be tin, although any suitable fuel may be used. A pre-pulse laser 16 emits a pre-pulse laser beam 17 which is incident upon the fuel. The pre-pulse laser beam 17 acts to preheat the fuel, thereby changing a property of the fuel such as its size and/or shape. A main laser 18 emits a main laser beam 19 which is incident upon the fuel after the pre-pulse laser beam 17. The main laser beam delivers energy to the fuel and thereby coverts the fuel into an EUV radiation emitting plasma 7.

A radiation collector 20, which may be a so-called grazing incidence collector, is configured to collect the EUV radiation and focus the EUV radiation at a point 6 which may be referred to as the intermediate focus. Thus, an image of the radiation emitting plasma 7 is formed at the intermediate focus 6. An enclosure structure 21 of the radiation source SO includes an opening 22 which is at or near to the intermediate focus 6. The EUV radiation passes through the opening 22 to an illumination system of a lithographic apparatus (e.g. of the form shown schematically in FIG. 1).

The radiation collector 20 may be a nested collector, with a plurality of grazing incidence reflectors 23, 24 and 25 (e.g. as schematically depicted). The grazing incidence reflectors 23, 24 and 25 may be disposed axially symmetrically around an optical axis O. The illustrated radiation collector 20 is shown merely as an example, and other radiation collectors may be used.

A contamination trap 26 is located between the plasma formation region 4 and the radiation collector 20. The contamination trap 26 may for example be a rotating foil trap, or may be any other suitable form of contamination trap. In some embodiments the contamination trap 26 may be omitted.

An enclosure 21 of the radiation source SO includes a window 27 through which the pre-pulse laser beam 17 can pass to the plasma formation region 4, and a window 28 through which the main laser beam 19 can pass to the plasma formation region. A mirror 29 is used to direct the main laser beam 19 through an opening in the contamination trap 26 to the plasma formation region 4.

The radiation sources SO shown in FIGS. 1 and 2 may include components which are not illustrated. For example, a spectral filter may be provided in the radiation source. The spectral filter may be substantially transmissive for EUV radiation but substantially blocking for other wavelengths of radiation such as infrared radiation.

Figure 3A:
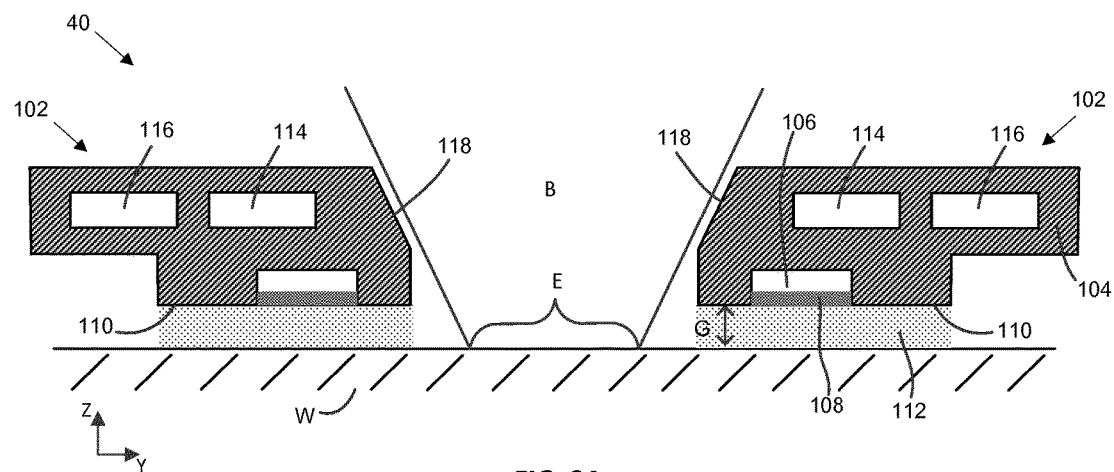
FIGS. 3A-3B schematically depict a cooling apparatus of the lithographic apparatus.
Figure 3B:
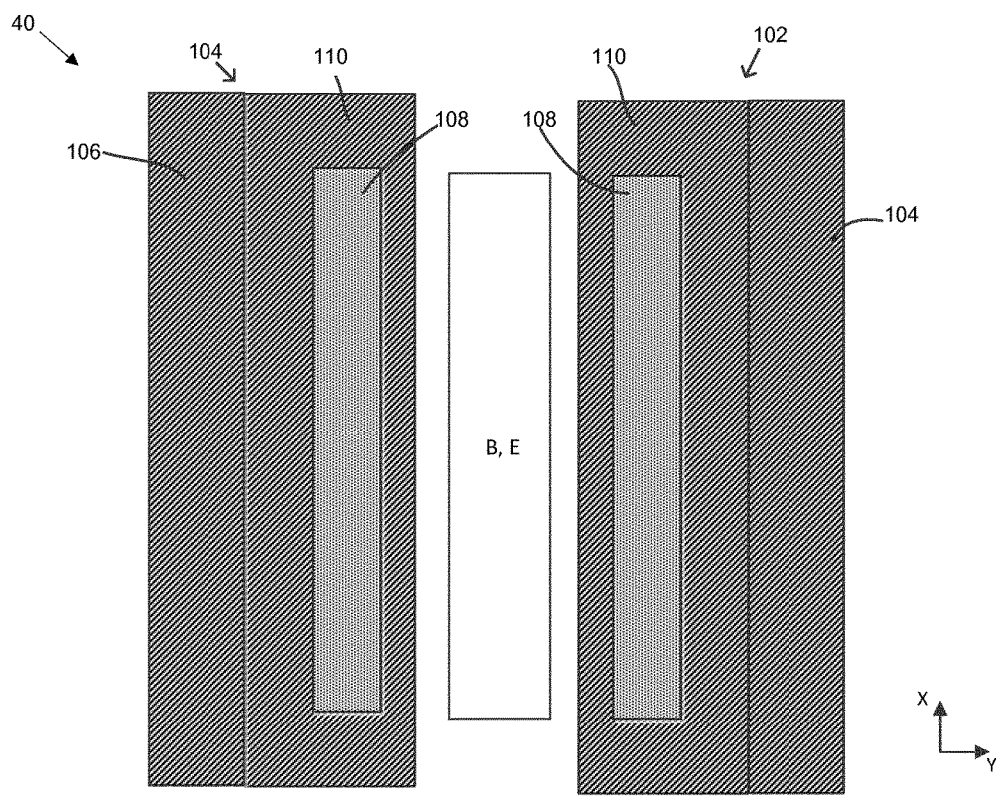

FIG. 3 schematically depicts a cooling apparatus 40 which may form part of an embodiment of the invention. The cooling apparatus 40 comprises two cooling elements 102 each configured to direct cooling gas onto a substrate W at a location which is adjacent to an exposure area E. The exposure area E is an area which is illuminated by a patterned radiation beam B during operation of a lithographic apparatus. The cooling apparatus 40 is schematically depicted in cross-section in FIG. 3A and schematically depicted viewed from below in FIG. 3B. FIG. 3A is enlarged relative to FIG. 3B. The cooling elements 102 may be mounted to the projection system PS of the lithographic apparatus LA (see FIG. 1).

Each cooling element 102 comprises a body 104 which is provided with a chamber 106. The chamber 106 has a floor 108 formed from a porous material (examples of suitable porous material are described below). The body 104 has a lowermost surface 110 which faces towards the substrate W. Part of the lowermost surface 110 is formed by the floor 108 of porous material. The lowermost surface 110 of the body 104, which may be substantially planar, is separated from the substrate W by a gap G which may for example be around 80 microns. The gap G may for example be less than 200 microns, and may for example be less than 100 microns. The gap G may for example be greater than 20 microns.

Cooling gas is delivered through the floor 108 of porous material and fills the gap G between the lowermost surface 110 of the body 104 and the substrate W. The cooling gas in the gap G is schematically depicted by a shaded area 112. The cooling gas 112 may for example be hydrogen (or may be some other gas). The cooling gas 112 has a temperature which is lower than the temperature of the substrate. The cooling gas 112 facilitates transfer of heat from the substrate W to the cooling element body 104, which also has a temperature that is lower than the temperature of the substrate. The cooling gas 112 thus acts to cool the substrate W. The cooling gas is delivered to the cooling elements 102 by a gas delivery conduit (not depicted).

The cooling elements 102 of FIGS. 3A and 3B further comprise first and second cooling fluid channels 114, 116 (not visible in FIG. 3B). Cooling fluid is pumped through the cooling fluid channels 114, 116 and thereby carries heat away from the cooling element 102. The cooling fluid may for example be nitrogen gas (or some other gas) and may be for example cooled to a temperature of around −100° C. The nitrogen gas may for example be held at a pressure which is above atmospheric pressure (e.g. greater than 4 bar, e.g. around 8 bar, e.g. 12 bar or less). The nitrogen (or other gas) acts to cool the cooling element 102 to a temperature which is below 0° C. The nitrogen (or other gas) may act to cool the cooling element 102 to a temperature which is below −50° C., and may act to cool the cooling element to a temperature which is below −70° C. (e.g. around −100° C.). Since the cooling element 102 is held at a temperature which is below 0° C., e.g. around −100° C., the cooling gas in the chamber 106 is also cooled to that temperature. Consequently, cooling gas 112 delivered through the porous floor 108 has the same temperature as the temperature of the cooling element 102.

The cooling gas is delivered at a rate which will provide a pressure of cooling gas 112 between the cooling element 102 and the substrate W which is greater than atmospheric pressure. The pressure may for example be in the excess of 500 pascals, and may for example be around 700 pascals. The pressure may for example be less than 1000 pascals. The cooling gas 112 may for example provide a heat transfer coefficient which is greater than 300 $W/m^2K$. The cooling gas 112 may for example provide a heat transfer coefficient which is less than 600 $W/m^2K$. The cooling gas 112 may for example provide a heat transfer coefficient of around 450 $W/m^2K$.

The cooling element 102 is located adjacent to the edge of the exposure area E. In this context the term 'adjacent' may be interpreted as meaning less than 1 cm from the edge of the exposure area E. The cooling element 102 may be less than 0.5 cm from an edge of the exposure area E, and may be around 1 mm from an edge of the exposure area. The cooling element 102 may be within the range 1 mm-1 cm from the edge of the exposure area E. The smaller the separation between the cooling element and the exposure area, the greater the extent to which some undesirable distortions of the substrate caused by substrate heating are avoided In order for the cooling element 102 to be located as close as possible to the exposure area E, the cooling element may be shaped such that it does not intersect with the patterned radiation beam B when it is at a desired distance from the exposure area E. Thus, for example, the cooling element in this embodiment is provided with a sloping inner surface 118 which faces towards the patterned radiation beam B. The sloping surface 118 may for example subtend an angle relative to the vertical which substantially corresponds with the angle subtended by the patterned radiation beam B relative to the vertical. This shape avoids the cooling element 102 having an innermost corner which projects into the patterned radiation beam B.

The cooling element 102 is thin (when measured in the vertical direction) because this allows the cooling element to be positioned closer to the patterned radiation beam B without intersecting with the radiation beam. Thus, for example, the cooling element may have a thickness in the vertical direction (the z-direction) which is 3 mm or less. The thickness of the cooling element 102 may for example be 2 mm or less. The cooling element 102 is sufficiently thick to allow space for the chamber 106 which receives the cooling gas and also to allow space for the cooling fluid channels 114, 116. A minimum thickness for the cooling element 102 may thus for example be around 1 mm.

The closer the cooling element 102 is to the exposure area E the greater the extent to which some undesirable distortions of the substrate caused by substrate heating are avoided. Thus, for example, a separation of less than 3 mm between the cooling element 102 and the edge of the exposure area E may be desirable. A separation of 2 mm or less may be preferred since this provides even more effective cooling. A separation of 1 mm or less may be most preferred, although this may be challenging to implement in practice. There may be for example a tolerance of around 0.3 mm of the position of the edge of the exposure area E. There may be a tolerance of for example around 0.3 mm of the accuracy with which the cooling elements 102 can be positioned relative to the exposure area E. The above mentioned values may take this into account. Thus, the above mentioned values may for example have an accuracy of +/−0.6 mm.

The lowermost surface 110 of the cooling element 102 may for example measure between 1 mm and 3 mm in the Y-direction (e.g. between 1.5 mm and 2 mm). The lowermost surface 110 of the cooling element 102 may for example measure less than 5 mm in the Y-direction. The length of the lowermost surface 110 in the Y-direction has a significant impact upon the amount of cooling which is provided to the substrate W because this determines the area of cooling gas 112 which is located between the cooling element 102 and the substrate. The floor 108 of porous material may for example be separated by around 0.5 mm from an inner edge of the cooling element 102 measured in the Y-direction (scanning direction). The floor 108 of porous material may for example have a length in the Y-direction of between 0.3 mm and 0.7 mm (e.g. around 0.5 mm).

The embodiment of FIG. 3, by providing cooling at locations close to the exposed area E, may reduce the tendency of the substrate to expand due to heating caused by the patterned radiation beam B. Such expansion is particularly problematic at the edge of the substrate because the substrate tends to be less well restrained by the substrate table WT at its edges. An additional benefit of the embodiment is that it may relax the stiffness tolerance with which burls of the substrate table WT must be provided (the required precision of stiffness of the burls is interrelated with expansion of the substrate due to heating).

Examples of porous materials which may be used are graphite (e.g. as sold by Xycarb Ceramics of Helmond, Netherlands) and sintered ceramics (e.g. as sold by Gimex of Geldermalsen, Netherlands). The porosity of the porous material may be reduced if desired by applying an epoxy layer together with a solvent to a surface of the porous material. The amount of solvent used may be selected such that a desired permeability of the layer is achieved.

Although the embodiment depicted in FIG. 3 has a floor 108 formed from porous material, in other embodiments the floor may be formed from a non-porous material with an array of holes being provided in the floor to allow cooling gas to be delivered through the floor. The holes may include properties mentioned further above in connection with the preceding embodiment. The holes and the pores are examples of openings through which cooling gas may flow.

The cooling apparatus 40 provides localised cooling of the substrate W. This may prevent localised heating of the substrate occurring to such an extent that significant slippage of the substrate over burls of the substrate table occurs. Improved removal of heat from the substrate W (and thus avoiding burl-slip) may be particularly important when the dose of energy delivered to the substrate is increased relative to a conventionally delivered dose.

As will be appreciated from FIG. 3B, the X-direction dimension of the floor 108 formed from porous material may correspond with the X-direction of the exposure area E. This may for example be a maximum X-direction dimension of exposure area which the lithographic apparatus is capable of illuminating (e.g. 26 mm).

The amount of cooling which is provided by the cooling elements 102 is generally constant as a function of X-direction location beneath the porous material 108. However, it may be desirable to provide different amounts of cooling at different X-direction locations. This is because heating of the substrate W caused by the patterned radiation beam B may be different at different X-direction positions of the substrate within the exposure area E. The amount of heating of the substrate W caused by the patterned radiation beam B depends upon the intensity of the radiation beam, and this may vary as a function of X-direction position across the exposure area E. The patterned radiation beam B is patterned by a mask MA (see FIG. 1). Different parts of the mask MA will have different reflectivities, the reflectivities being determined by properties of pattern features on the mask. For example, it may be the case that a mask MA comprises a first area which has a high density of reflective features and a second area which has a low density of reflective features. The high density of reflective features will reflect more of the radiation beam B. Consequently, a portion of the exposure area E which corresponds with the high density of reflective features on the mask MA will be heated more by the patterned radiation beam B than a portion of the exposure area E which corresponds with a low density of reflective features on the mask. Embodiments of the invention address this difference of heating.

Figure 4A:
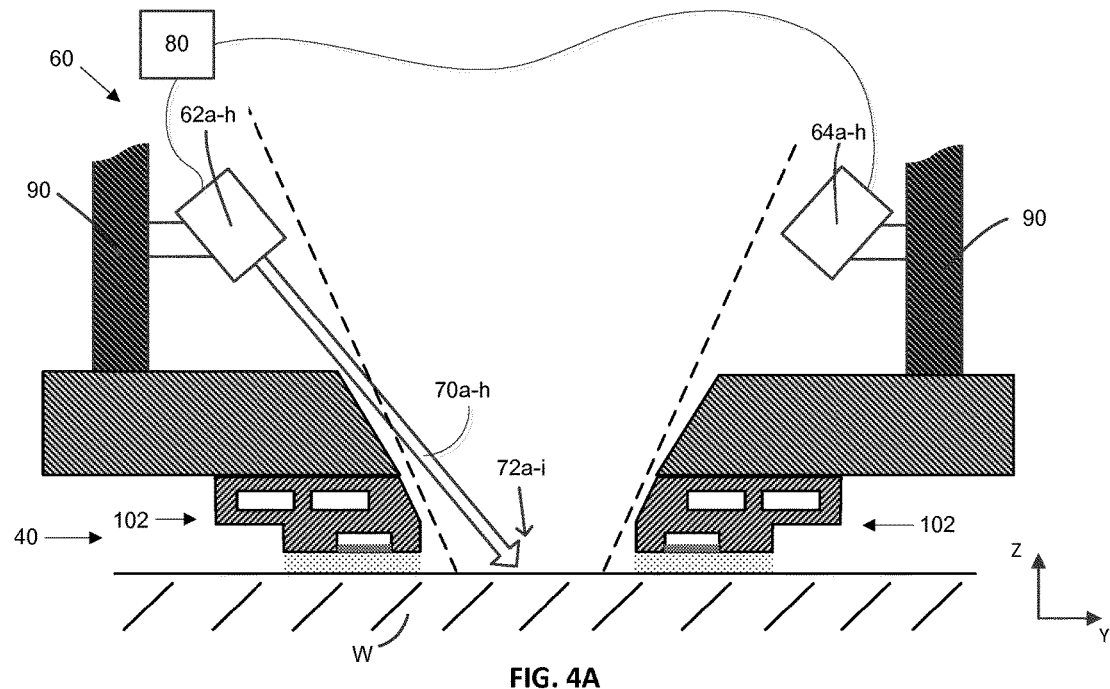
FIGS. 4A-4B schematically depicts a heating apparatus according to an embodiment of the invention and schematically depicts other elements of the lithographic apparatus.
Figure 4B:
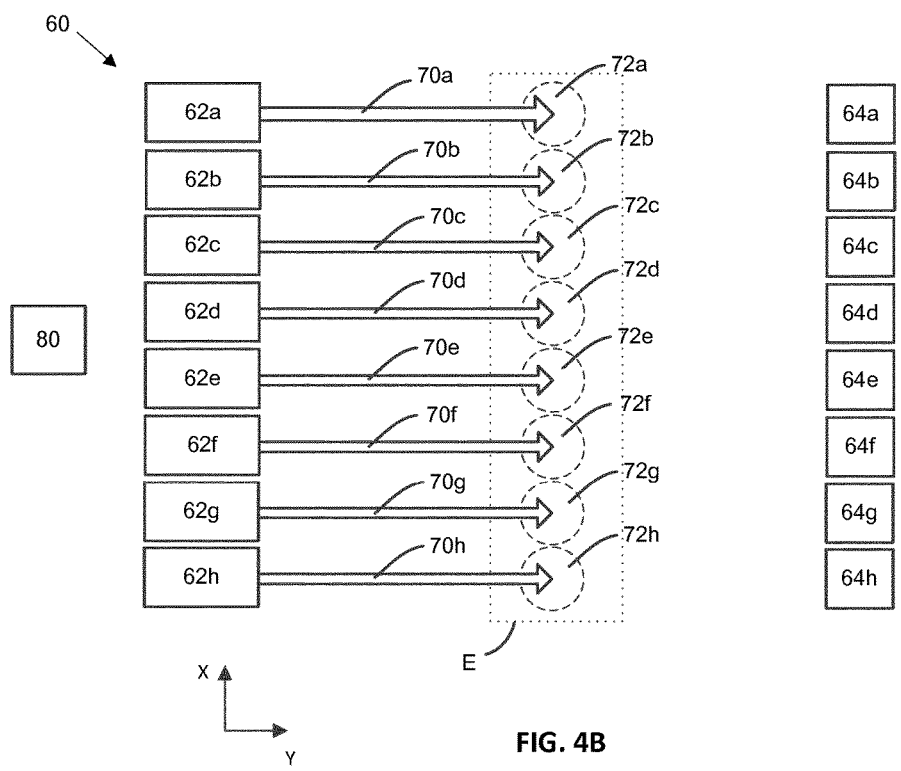

FIG. 4 schematically depicts an embodiment of the invention. The embodiment comprises a cooling apparatus 40 and a heating apparatus 60. The cooling apparatus 40 is as described in connection with FIG. 3 and is not described again here. The heating apparatus 60 is depicted in cross-section in FIG. 4A and viewed from above in FIG. 4B. The heating apparatus 60 comprises a series of lasers 62a-h which emit laser beams 70a-h that illuminate and heat a series of areas 72a-h within the exposure area E. The areas 72a-h are distributed across the exposure area E in the non-scanning direction (the X-direction). The lasers 62a-h may be infra-red lasers and the radiation beams 70a-h may be infra-red beams. A controller 80 controls the lasers 62a-h to adjust the power of the radiation beams 70a-h as required in order to selectively provide desired amounts of heating at different areas 72a-h within the exposure area E. The lasers 62a-h may be connected to walls 90 (or other elements) of the projection system of the lithographic apparatus. The radiation beams 70a-h may be referred to as additional radiation beams because they are in addition to the patterned radiation beam B.

Consider the above example of a mask MA which includes an area with a low density of reflective features and an area with the high density of reflective features. The mask area with the high density of reflective features causes considerably more heating of the substrate W than the mask area with the low density of reflective features (because the high density of reflective features reflects a greater proportion of the radiation beam B onto the substrate). The area which experiences less heating may for example correspond with an upper half of the exposure area E depicted in FIG. 4B, with the area which experiences more heating corresponding with a lower half of the depicted exposure area. A first group of the lasers 62a-d emit laser beams 70a-d which illuminate and heat areas 72a-d in the upper half of the exposure area E. The laser beams 70a-d heat those areas 72a-d to compensate for the lesser amount of heating that they receive from the radiation beam B. A second group of the lasers 62e-h do not emit laser beams because no additional heating of the lower half of the exposure area E is needed. As a result of the operation of the lasers 62a-h the net heating of the substrate W across the exposure area E is substantially constant as a function of X-direction position (or varies less than would be the case if the heating apparatus 60 were not present). In other words, temperature uniformity of the substrate in the X-direction is improved. Consequently, distortion of the substrate which would otherwise have been caused by different amounts of heating at different X-direction positions on the substrate W is avoided (or is reduced). If a small degree of heating of the lower half of the exposure area E is desired then the second group of lasers 62e-h may emit laser beams, although with lower power than the laser beams emitted by the first group of lasers 62a-d. In general, the powers of the laser beams 70a-h emitted by the lasers 62a-h may be adjusted to provide different amounts of heating, and this may be used to improve temperature uniformity of the substrate in the X-direction (the non-scanning direction).

The heating apparatus 60 may further comprise a series of detectors 64a-h which are arranged to detect infra-red radiation (although these may be omitted in some embodiments). The infra-red radiation may be the sum of reflected laser beams 70a-d and radiation emitted by the substrate W due to its temperature. Outputs from the detectors 64a-h may be used by the controller 80 when determining what power of laser beam 70a-h is to be emitted by each laser 62a-h. The detectors 64a-h may be connected to walls 90 (or other elements) of the projection system of the lithographic apparatus. The detectors 64a-h may be infra-red detectors (i.e. they may be configured to detect infra-red radiation and not detect visible or ultraviolet radiation).

The detectors 64a-h may be omitted in some embodiments. If the detectors 64a-h are not present then control of the radiation sources 62a-h may be feed-forward control (e.g. based upon previously performed measurements). Feed-forward control is discussed further below.

Other radiation sources such as for example LEDs may be used instead of lasers 62a-h. The laser beams 70a-h are specific examples of radiation beams. The radiation sources (e.g. lasers or LEDs) may emit infra-red radiation. Infra-red radiation is advantageous because it is not actinic, i.e. does not cause significant chemical changes in resist provided on the substrate W. Radiation with a wavelength of around 800 nm may be used. This is an advantageous wavelength to use because it is absorbed well by silicon wafers (the substrate W is likely to be a silicon wafer).

Although eight radiation sources (lasers) 62a-h are depicted in FIG. 4B, this is merely schematic and the heating apparatus 60 may comprise some other number of radiation sources. The number may be determined by the number of illuminated areas which it is desired to have in the exposure area E. The number of illuminated areas may determine the spatial precision with which the temperature of the substrate W can be controlled. In one example the heating apparatus comprises at least 10 radiation sources. In another example the heating apparatus comprises at least 20 radiation sources. In a further example the heating apparatus comprises at least 50 radiation sources (e.g. 100 radiation sources or more).

Although not depicted, there may be some overlap between the areas 72a-h which are illuminated by the radiation beams 70a-h. The radiation beams 70a-h may have Gaussian profiles or other profiles which reduce gradually in intensity as a function of distance from the centres of the beams. Portions of the areas 72*a-h* which are illuminated by lower intensity portions of the radiation beams 70*a-h* may overlap.

The size of the illuminated areas 72*a-h* determines the spatial resolution (or granularity) at which the heating of the substrate W can be adjusted. Thus, theoretically making the illuminated areas 72*a-h* as small as possible would be desirable in order to provide the highest possible resolution of heating adjustment. However, heat will spread outwards from each illuminated area 72*a-h*, and consequently there is a minimum achievable resolution of heating. In addition, thermal deformation of the substrate W decreases as a function of size of the illuminated area, and may become negligible if an illuminated area is very small (e.g. measuring significantly less than 100 microns across).

Although the depicted illuminated areas 72*a-h* are circular, the illuminated areas may have some other shape (e.g. generally rectangular in shape or having a non-geometric shape). The illuminated areas 72*a-h* may be sufficiently large to substantially fill the exposure area E. For example, the exposure area E may be substantially filled by a single row of illuminated areas 72*a-h*. Each illuminated area may for example have a Y-direction dimension of around 2 mm (this may correspond with the width of the exposure area). Each illuminated area may for example have an X-direction dimension of around 2 mm. If the exposure area has a length of 26 mm then this will correspond with 13 illuminated areas.

Although only a single row of illuminated areas 72*a-h* is depicted in FIG. 4B, more illuminated areas may be provided. For example, two rows of illuminated areas may be provided. The two rows of illuminated areas may substantially fill the exposure area E. Each illuminated area may for example have a Y-direction dimension of around 1 mm. If the exposure area E is 2 mm wide then two rows of illuminated areas may substantially fill the exposure area E. Each illuminated area may for example have an X-direction dimension of around 1 mm. If the exposure area has a length of 26 mm then this will correspond with 26 illuminated areas. Two rows of illuminated areas in such an example will correspond with 52 illuminated areas. Using two (or more rows) of illuminated areas advantageously provides a higher spatial frequency of substrate temperature adjustment (compared with using one row of illuminated areas).

In general, the illuminated areas may be provided as an array of illuminated areas which extends across the exposure area E in the non-scanning direction (the X-direction).

In an embodiment, sufficient illuminated areas to substantially fill the exposure area E may be provided.

The illuminated areas 72*a-h* may for example have a maximum dimension of 2 mm or less, may have a maximum dimension of 1 mm or less, or may have a maximum dimension of 0.5 mm or less. Reducing the maximum dimension beyond 100 microns may not give any further improvement of heating resolution. Thus the illuminated areas may have maximum dimensions of around 100 microns or more (although smaller illuminated areas are possible).

Any suitable number of radiation sources may be used.

In an embodiment the exposure area E may have a length of 26 mm and a width of 2 mm, and may thus have a total area of 52 mm$^2$. Each illuminated area may have a size of 0.1 mm$^2$, in which case 520 illuminated areas will fill the exposure area E. Thus, 520 radiation sources may be used, each radiation source providing a radiation beam to illuminate one area. It may however be costly to provide such a large number of radiation sources. If each illuminated area has a size of 0.5 mm$^2$ then 104 radiation sources may be used (for an exposure area of 52 mm$^2$). Providing such a number of radiation sources may be less costly than providing 520 radiation sources but may still incur a significant cost. If it is desired to keep costs low then a single row of illuminated areas may be used. As a compromise between cost and heating resolution two rows of illuminated areas may be used.

The heating apparatus 60 may be configured to deliver heat to the substrate W at a rate which is less than the rate at which the cooling apparatus 40 is able to remove heat from the substrate. In other words the heating power of the heating apparatus 60 may be less than the cooling power of the cooling apparatus 40.

The heating power provided by the heating apparatus 60 may be less than or equal to the amount of power which the patterned radiation beam B is capable of delivering to the substrate. There may be no need for the heating apparatus 60 to provide heating power which exceeds the power delivered to the substrate by the patterned radiation beam. The heating apparatus 60 may merely provide localised heating compensation to parts of the exposure area E which are not heated by the patterned radiation beam (or parts of the exposure area which are heated less by the patterned radiation beam than other parts of the exposure area). For example, if the patterned radiation beam B has a maximum power at the substrate of 5 W then the heating apparatus 60 may be configured to provide up to 5 W of power. In an embodiment, the heating apparatus 60 may be capable of providing at least 1 W of power.

In an embodiment, at least ten radiation beams may be used to illuminate and heat the exposure area. Where this is the case, each radiation beam may have a power of up to for example 0.5 W. If the radiation beams are emitted by different radiation sources (e.g. lasers) then each radiation source may be capable of emitting a beam with a power of at least 0.5 W. In an embodiment more than ten radiation beams may be used to illuminate and heat the exposure area (e.g. twenty or more radiation beams). Where this is the case, each radiation source may for example be capable of emitting a beam with a power of at least 0.2 W. If a higher number of radiation beam sources is used then the power capability of each radiation source may be correspondingly reduced. In general, radiation sources which are used to provide radiation beams that illuminate and heat the exposure area may be capable of emitting beams with powers of at least 0.1 W.

The above description relates to the situation in which there is a difference of reflectivity across a mask MA in the X-direction. However, there may additionally or alternatively be a difference of reflectivity across a mask MA in the Y-direction. The cooling apparatus 40 may not be controllable sufficiently quickly to compensate for different amounts of heating arising from the varying mask reflectivity in the Y-direction. Where this is the case, the heating apparatus 60 may be used to deliver heat to the substrate W which compensates for differences in substrate heating caused by Y-direction reflectivity variation of the mask MA.

The radiation sources 62*a-h* (e.g. lasers) may be controlled by the controller 80 using feed-forward control. Where this is done, the reflectivity of the mask MA is measured as a function of position on the mask (e.g. using a measurement tool or using sensors provided in the lithographic apparatus). A resulting reflectivity map is used to determine the levels of heating that will be experienced by a wafer W during an exposure performed using the mask MA. Radiation beam powers to be provided by the radiation sources 62*a-h* in order to compensate for differences of wafer heating are then determined. Once they have been determined the radiation beam powers are used during each exposure of the substrate W using the mask MA. If feed-forward control is used exclusively then the sensors 64*a-h* are not required.

The radiation sources 62*a-h* (e.g. lasers) may be controlled by the controller 80 using feedback control. Where this is done, the detectors 64*a-h* monitor infra-red radiation received from different X-direction positions across the substrate within the exposure area E. In an embodiment it may be desirable for the substrate to have substantially the same temperature at all positions in the X-direction. The detectors 64*a-h* measure infra-red radiation received from each area 72*a-h* in the exposure area E, and the measured infra-red radiation is used by the controller 80 as an indication of the temperature of the substrate W at those areas. The powers of the beams 70*a-h* output from by the radiation sources 62*a-h* are adjusted accordingly. For example, if one area 72*c* is colder than the other areas then the power of the radiation beam 70*c* which illuminates that area is increased. For example, if one area 72*f* is hotter than the other areas then the power of the radiation beam 70*f* which illuminates that area is reduced. The lasers 62*a-h* (or other radiation sources) and the controller 80 may have a response time of 1 ms or less. This is sufficiently short to allow feed-back control to be used effectively in a scanning lithographic apparatus operating with a throughput in excess of 100 substrates per hour.

Feed-forward and feedback control may be used in combination.

Errors may occur when the controller 80 determines the temperature of the substrate W based upon signals received from the infra-red detectors 64*a-h*. An error is caused by portions of the radiation beams 70*a-h* reflecting off the substrate W and being incident upon the infra-red detectors 64*a-h*. A further error is caused by the infra-red detectors 64*a-h* looking through the substrate W and measuring the temperature of the substrate table WT (see FIG. 1). These errors may be reduced by providing an infra-red absorbing coating on a back-side of the substrate W (i.e. the opposite side from the side which received the patterned radiation beam B). When the coating is provided, the substrate W absorbs infra-red radiation and thus reflection of the laser beams 70*a-h* is avoided or reduced. The substrate W will be heated from below by the coating and will emit infra-red radiation depending upon the temperature of the substrate. Thus, when an infra-red absorbing coating is provided on the back-side of the substrate W, the infra-red detectors 64*a-h* may provide more accurate measurements of the temperature of the substrate.

In some instances, significant temperature measurement errors may occur even when an infra-red absorbing coating is present on the back-side of the substrate W. For example, if the substrate W has already been provided with one or more metalized layers in a pattern then these layers will reflect infra-red radiation. Because the metalized layers are provided as a pattern, the reflection of infra-red radiation is not uniform and this may cause temperature measurement errors. This reflection of by metalized layers on the substrate may be measured during a calibration process, and the results of the calibration subsequently used to correct temperatures which are determined using outputs from the infra-red detectors 64*a-h*.

In an embodiment, the calibration process comprises illuminating the substrate W using the radiation sources 62*a-h* when without the EUV radiation beam B being present. Infra-red radiation is then detected using the detectors 64*a-h* as a function of substrate location. The detected infra-red radiation for a given location on the substrate is indicative of the reflectivity of the substrate W at that location. Infra-red reflectivity as a function of position on the substrate W is recorded. During substrate exposure the infra-red reflectivity of the substrate W is taken into account when determining the temperature of locations on the substrate.

The calibration process may be performed for a first substrate of a lot of substrates (e.g. 16 to 25 substrates). The calibration process may be performed for a first substrate of any other number of substrates, provided that the substrates all have the same metallic layer patterns.

The calibration process may be performed using the lasers 62*a-h* (or other radiation sources) and detectors 64*a-h* which are provided in the projection system B of the lithographic apparatus. Alternatively, the calibration process may be performed using lasers (or other radiation sources) and detectors which are provided elsewhere. For example, in a dual stage lithographic apparatus which comprises a measurement side and an exposure side, the radiation sources and detectors may be provided on the measurement side of the lithographic apparatus. Where this is the case the calibration process may be performed for each substrate (e.g. at the same time as measuring the topology of the substrate). In another example the lasers and detectors may be provided in a different tool. The lasers and detectors may for example be provided in a substrate handling apparatus (which may be referred to as a wafer handler).

In addition to affecting temperature measurements, metallic layer patterns may also affect the extent to which illumination of the substrate using the radiation beams 70*a-h* increases the temperature of the substrate. A non-metallic area will absorb more infra-red radiation and be heated more effectively than a metallic area. Where a calibration process is performed, e.g. as set out above, the results of the calibration process may be used during control of the radiation sources 62*a-h* to account for this.

As noted above, feed-forward control and feedback control may be used in combination.

The heating apparatus 60 may be used to reduce temperature non-uniformity of the substrate W in the exposure area E. This is advantageous because it reduces distortion of the substrate W in the exposure area E and therefore allows an improvement of overlay to be achieved (overlay being the accuracy with which a newly projected pattern aligns with a previously projected pattern).

In an embodiment, it may be desired to deliberately cause some distortion of the substrate W in the exposure area E using the heating apparatus. This may be done for example to compensate for known distortion of a projected image which is caused by the projection system. In one example, the projection system may introduce a localised magnification, which may be referred to as a D3 (fisheye) distortion. Where this occurs, the heating apparatus 60 may deliver additional heat to the substrate area W at which the localised distortion is incident. The additional heat will cause localised expansion of the substrate W which compensates (at least partially) for the D3 distortion.

The heating apparatus 60 may be used to compensate for other distortions of a projected image. An advantage of correcting for projected image distortions using the heating apparatus is that this may allow the lithographic apparatus to have a less complex projection system (i.e. the lithographic apparatus may have mirrors which have less adjustment capabilities).

In an embodiment the heating apparatus may include optics (not depicted). The optics may for example comprise a microlens array configured to focus radiation beams onto the substrate. The optics may for example comprise lenses configured such that the detectors 64*a*-*h* view different areas within the exposure area E.

Although the above description refers to infra-red lasers, any suitable radiation sources may be used (e.g. infra-red radiation sources) to provide the additional radiation beams. One alternative to infra-red lasers is infra-red LEDs.

In schematic illustrations of embodiments of the invention the exposure area E is depicted as a rectangle. This is for ease of illustration, and it will be appreciated that the exposure area E may have some other shape. The exposure area E may for example include some curvature along the X-direction (e.g. it may have a shape which generally resembles a banana).

Although depicted embodiments of the invention include a cooling apparatus and a heating apparatus, the heating apparatus may be provided without a cooling apparatus being present. In such a situation the heating apparatus provides better uniformity of heating than would be the case if the heating apparatus was not present, although total heating of the substrate will be increased.

In depicted embodiments the substrate area which is illuminated and heated by the radiation beams lies within the exposure area. This arrangement may be preferred because it is the most direct way of compensating for non-uniform heating caused by the patterned radiation beam. However, it is not essential. The radiation beams may illuminate and heat a substrate area which partially overlaps with the exposure area. The radiation beams may illuminate and heat a substrate area which does not overlap with the exposure area (e.g. a substrate area which is adjacent to the exposure area). Illuminating and heating areas which partially overlap with the exposure area or which lie outside of the exposure area may provide a beneficial effect (in an equivalent manner to the way in which the cooling apparatus provides a beneficial effect by providing cooling outside of the exposure area).

In the illustrated embodiment a separate radiation source is used for each illuminated area. However, this need not necessarily be the case. In an alternative embodiment (not illustrated) a radiation source is used to illuminate an array of individually controllable mirrors. The mirrors are controlled by a controller to direct radiation to locations in the exposure area as desired. In one example a single mirror is used for each illuminated area. In this example the area is either illuminated or is not illuminated (different powers of illumination are not possible). In another example multiple mirrors are used for each illuminated area. In this example different powers of illumination may be selected by selecting the number of mirrors which direct radiation towards the illuminated area.

Although embodiments of the invention have been described in the context of a scanning lithographic apparatus, the invention may be used in a non-scanning (stepping) lithographic apparatus.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIGS. 1 and 2 depict the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although embodiments of the invention have been described in the context of an EUV lithographic apparatus, the invention may also be used in DUV lithographic apparatus.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A lithographic apparatus comprising:
a projection system configured to project a patterned radiation beam that is patterned by a mask to form an exposure area on a substrate held on a substrate table, and a heating apparatus comprising one or more radiation sources configured to provide one or more additional radiation beams which illuminate and heat part of the substrate during the exposure, wherein the heating apparatus is configured to heat the part of the substrate based on a reflectivity of the mask.

2. The lithographic apparatus of claim 1, wherein the heating apparatus is configured to heat the part of the substrate based on a reflectivity variation of the mask in a scanning direction and/or in a non-scanning direction.

3. The lithographic apparatus of claim 1, wherein the part of the substrate which is illuminated and heated by the one or more additional radiation beams during exposure includes at least part of the exposure area.

4. The lithographic apparatus of claim 3, wherein:
the lithographic apparatus is a scanning lithographic apparatus, and
the one or more additional radiation beams comprise a plurality of radiation beams which are distributed in a non-scanning direction across the exposure area.

5. The lithographic apparatus of claim 1, wherein the one or more radiation sources are configured to illuminate an array of areas which at least partially overlaps with the exposure area.

6. The lithographic apparatus of claim 5, wherein the array of illuminated areas substantially fills the exposure area.

7. The lithographic apparatus of claim 1, wherein the one or more radiation sources comprises a plurality of radiation sources which are configured to illuminate different areas.

8. The lithographic apparatus of claim 7, wherein the radiation sources are individually controllable to allow adjustment of the powers of radiation beams output by the radiation sources.

9. The lithographic apparatus of claim 1, further comprising a plurality of detectors configured to receive infra-red radiation from different areas on the substrate.

10. The lithographic apparatus of claim 9, wherein the plurality of detectors are configured to receive infra-red radiation from areas which are illuminated by the one or more radiation sources.

11. The lithographic apparatus of claim 1, further comprising a controller configured to control the power of radiation delivered to the illuminated part of the substrate.

12. The lithographic apparatus of claim 11, wherein the controller uses feed-forward control which takes into account a measured reflectivity of a mask used to pattern the radiation beam.

13. The lithographic apparatus of claim 11, wherein the controller uses feed-forward control which takes into account a measured reflectivity of the substrate.

14. The lithographic apparatus of claim 10, wherein the controller uses feedback control which takes into account outputs from the plurality of detectors.

15. The lithographic apparatus of claim 1, further comprising a cooling element located above the substrate table and adjacent to the exposure area, the cooling element is configured to remove heat from the substrate.

16. A lithographic method comprising:
patterning a radiation beam using a mask;
projecting the patterned radiation beam to expose an exposure area on a substrate held on a substrate table; and
using one or more additional radiation beams to illuminate and heat part of the substrate during the exposure of the exposure area, such that heating of the part of the substrate is based on a reflectivity of the mask.

* * * * *